United States Patent [19]

Morrison, Jr.

[11] 4,265,729

[45] *May 5, 1981

[54] MAGNETICALLY ENHANCED SPUTTERING DEVICE

[75] Inventor: Charles F. Morrison, Jr., Boulder, Colo.

[73] Assignee: Vac-Tec Systems, Inc., Boulder, Colo.

[*] Notice: The portion of the term of this patent subsequent to Jul. 31, 1996, has been disclaimed.

[21] Appl. No.: 19,284

[22] Filed: Mar. 9, 1979

Related U.S. Application Data

[63] Continuation-in-part of Ser. No. 946,370, Sep. 27, 1978, Pat. No. 4,180,450, which is a continuation-in-part of Ser. No. 935,358, Aug. 21, 1978, Pat. No. 4,162,954.

[51] Int. Cl.³ ............................................. C23C 15/00
[52] U.S. Cl. .................................. 204/298; 204/192 R
[58] Field of Search ................ 204/192 R, 192 C, 298

[56] References Cited

U.S. PATENT DOCUMENTS

| | | | |
|---|---|---|---|
| 3,956,093 | 5/1976 | McLeod | 204/192 |
| 4,046,660 | 9/1977 | Fraser | 204/192 C |
| 4,060,470 | 11/1977 | Clarke | 204/192 R |
| 4,100,055 | 7/1978 | Rainey | 204/298 |
| 4,116,806 | 9/1978 | Love et al. | 204/298 |
| 4,155,825 | 5/1979 | Fournier | 204/192 R |
| 4,162,954 | 7/1979 | Morrison, Jr. | 204/298 |
| 4,194,962 | 3/1980 | Chambers et al. | 204/298 |

FOREIGN PATENT DOCUMENTS

| | | | |
|---|---|---|---|
| 2707144 | 8/1977 | Fed. Rep. of Germany | 204/298 |
| 2002036 | 2/1979 | United Kingdom | 204/298 |

Primary Examiner—Aaron Weisstuch
Attorney, Agent, or Firm—Gerald J. Ferguson, Jr.; Joseph J. Baker

[57] ABSTRACT

A magnetically enhanced sputtering device including magnet means for establishing a magnetic field where the lines of force thereof extend over and may pass through the cathode sputtering surface at one predetermined area thereof. Preferably, the majority of the lines of force passing through said predetermined area of the sputtering surface are inclined at angles of 45° or less with respect to the surface. The magnet means may be disposed on the side of the cathode opposite the sputtering surface where the flux therein extends substantially parallel to the sputtering surface.

Means for shaping the magnetic field at least along the direction of the lines of force may also be provided where the field shaping means may render the lines of force more parallel to the sputtering surface to thereby enhance uniformity of erosion of the sputtering surface at least in the direction of the lines of force and/or the field shaping may cause the lines of force to be substantially perpendicular to an edge of the sputtering surface to thereby substantially limit erosion of the sputtering surface beyond the edge.

The magnet means may cause a closed loop configuration of the lines of force where the closed loop configuration has at least some non-linear portions. Preferably flexible magnetic means may be employed for enhancing the uniformity of the magnetic field along the non-linear portions.

78 Claims, 31 Drawing Figures

FIG. 5
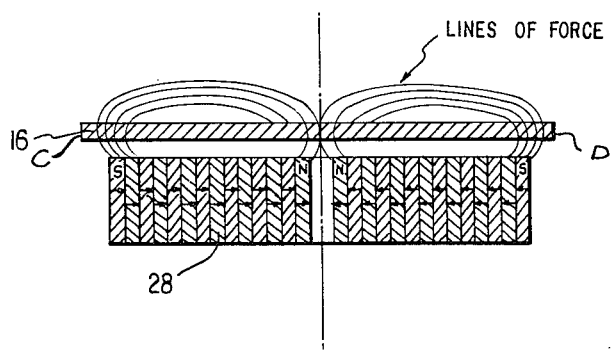
FIG. 6
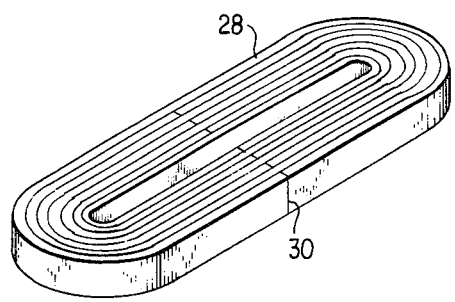
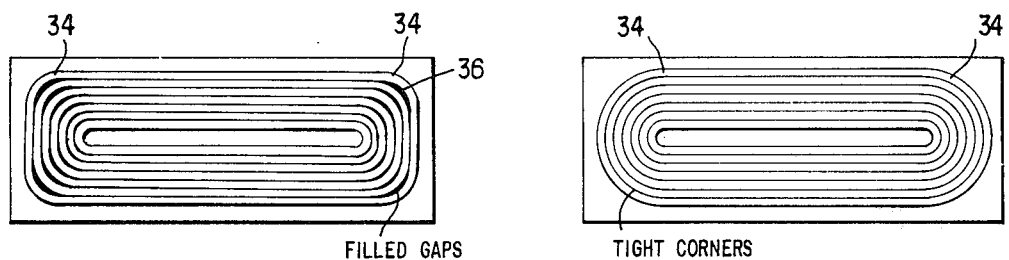
FIG. 7                                  FIG. 8
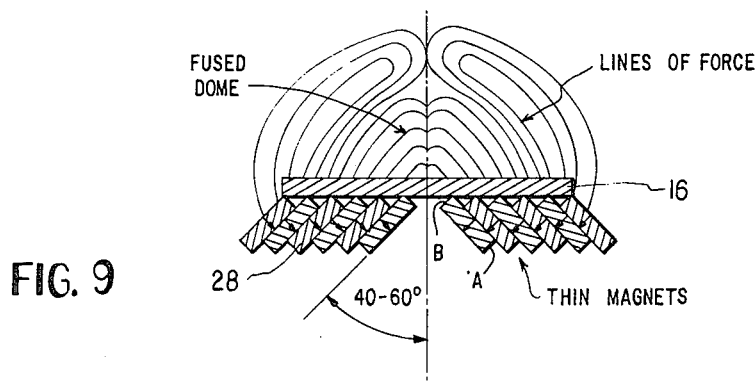
FIG. 9

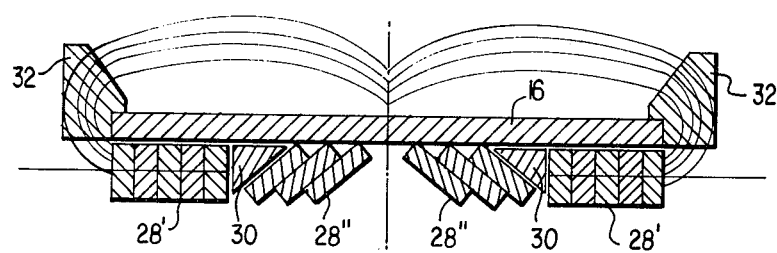
FIG. 10
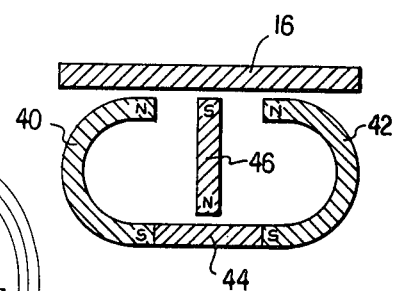
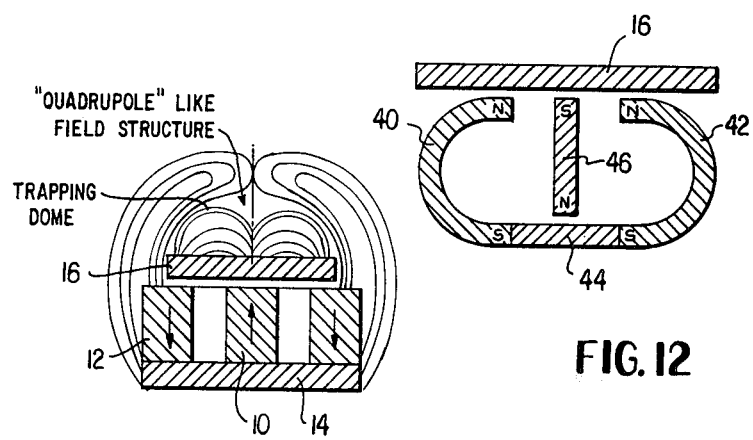
FIG. 11  FIG. 12
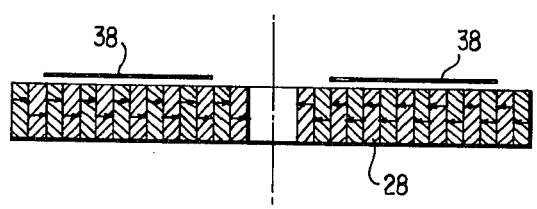
FIG. 13
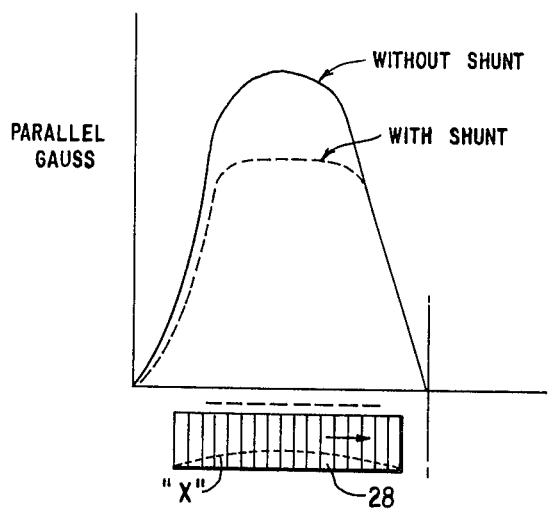
FIG. 14

FIG. 15
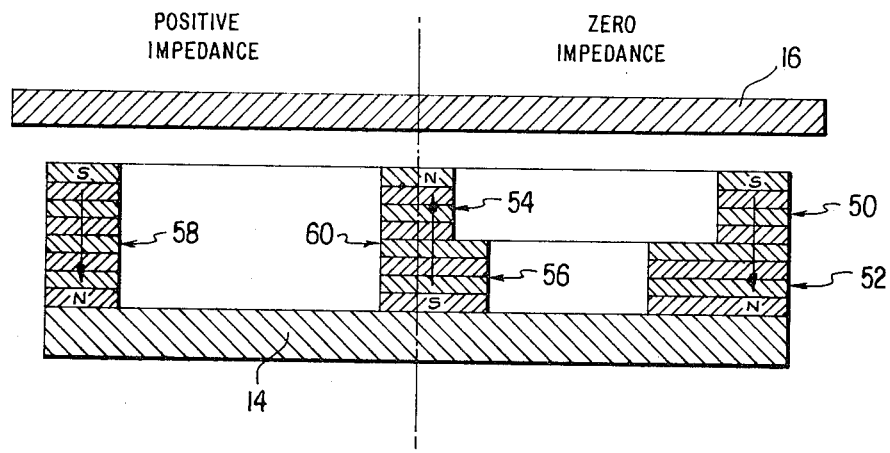
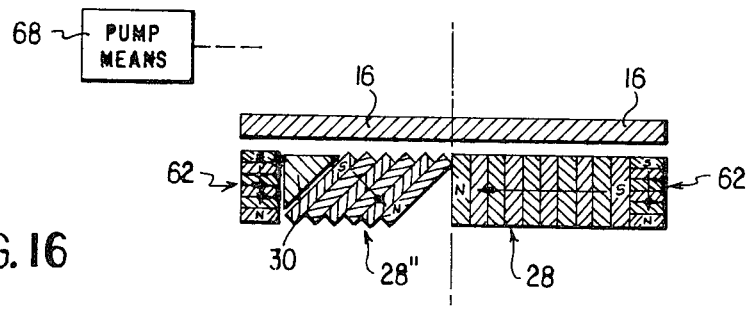
FIG. 16
FIG. 17
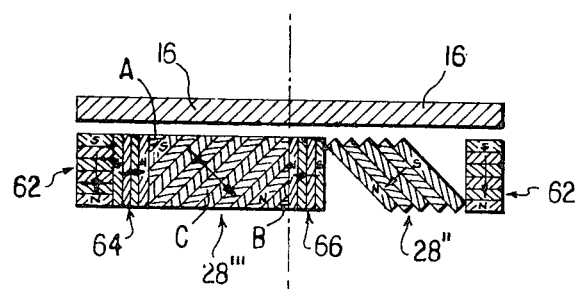

FIG. 28
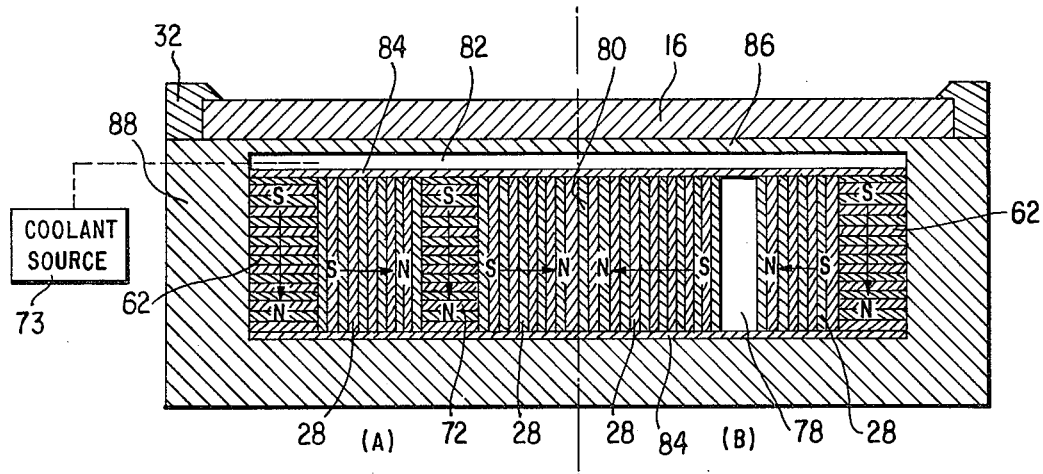
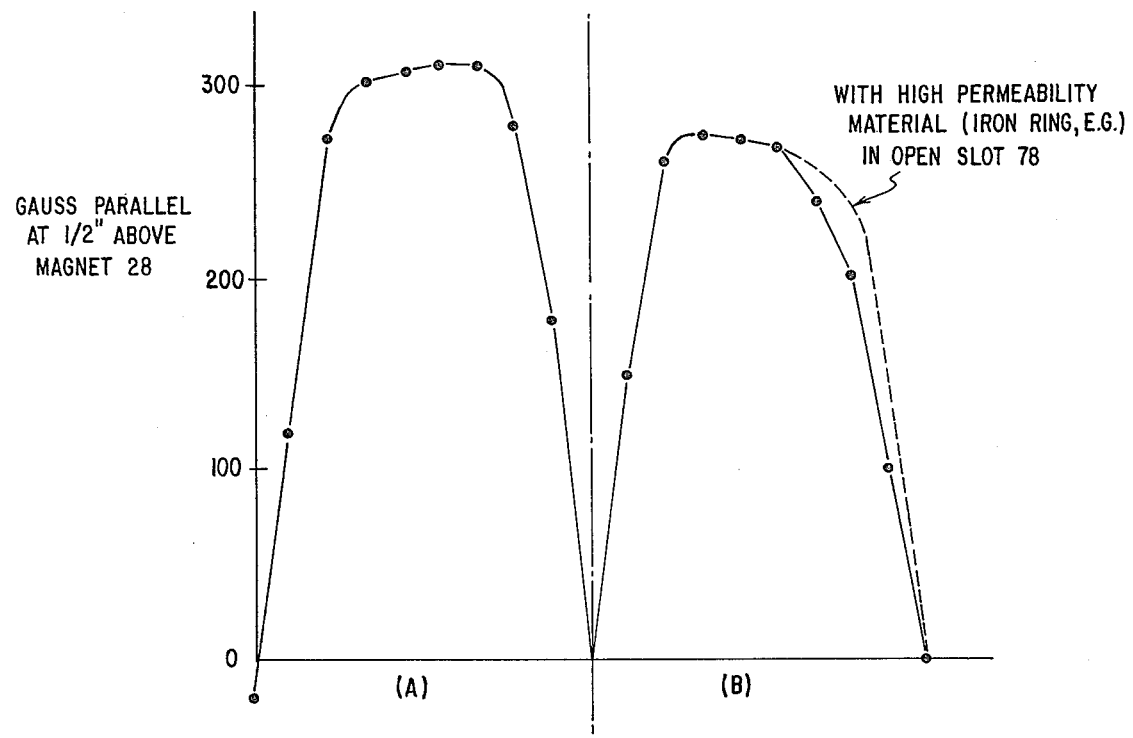
FIG. 29

MAGNETICALLY ENHANCED SPUTTERING DEVICE

RELATED APPLICATIONS

This application is a continuation-in-part of co-pending U.S. Application Ser. No. 946,370 filed Sept. 27, 1978, now U.S. Pat. No. 4,180,450, which in turn is a continuation-in-part of co-pending U.S. Application Ser. No. 935,358 filed Aug. 21, 1978 by the present applicant, Charles F. Morrison, Jr., now U.S. Pat. No. 4,162,954.

BACKGROUND OF THE INVENTION

1. Field of the Invention

This invention relates to magnetron sputtering devices.

2. Discussion of Prior Art

FIGS. 1 and 2 are cross-sectional and perspective views respectively of a representative prior art planar magnetron sputtering device comprising inner magnet 10 and outer magnet 12 (both of which usually comprise a number of sections) where the magnets are shunted by an iron pole plate 14. Disposed above the magnetic structure is a cathode or target 16 (not shown in FIG. 2). The magnetic lines of force are as shown in FIG. 1 where they exit from and return through cathode 16, a similar technique being employed in U.S. Pat. No. 3,878,085 where the magnetic lines also enter and exit from the cathode surface.

An electric field is established between (a) a ring-like anode 17, which may be disposed around and spaced from cathode 16, (or the chamber wall may serve this function) and (b) the target whereby electrons are removed from the cathode. Due to the configuration of the lines of magnetic force (the illustration of which is approximate), the removed electrons tend to concentrate in regions A where the lines of force are substantially parallel to the upper surface of target 16. There the electrons ionize gas particles which are then accelerated to the target to dislodge atoms of the target material. The dislodged target material then typically deposits as a coating film on an object to be coated. Assuming the object to be coated is in strip form or is mounted on a strip moving in the direction of the arrow shown in FIG. 2, the object will be uniformly coated, the strip being narrower in width than the length of the sputtering device.

Once the ionizing electrons are removed from the target, they travel long paths because they circulate in a closed loop defined between inner magnet 10 and outer magnet 12, the loop being above target 16. Hence, the electrons are effective in ionizing the gas particles. However, since most of the ionizing electrons are concentrated in regions A, the ionized gas particles will mainly erode cathode 16 in regions A'. Such uneven disintegration of the target is undesirable in that the target materials are most often extremely pure and accordingly, very expensive.

Another prior art arrangement is shown in cross-section in FIG. 3 where parallel magnets 18 and 20 are employed with pole pieces 22 and 24. However, this configuration is essentially the same as that of FIGS. 1 and 2 in its function and is subject to the same shortcomings.

SUMMARY OF THE INVENTION

It is an important object of this invention to provide an improved planar magnetron sputtering device wherein the target is more uniformly disintegrated.

It is a further object of this invention to provide an improved planar magnetron sputtering device of small dimensions and high power output.

It is a further object of this invention to provide improved planar sputtering devices which are stable at very low pressures and which have an I-E characteristic that exhibits a zero dynamic impedance.

Other objects and advantages of this invention will be apparent from a reading of the following specification and claims taken with the drawing.

BRIEF DESCRIPTION OF THE DRAWING

FIG. 5 is a cross-sectional view of an illustrative magnetic structure in accordance with a preferred embodiment of the invention.

FIG. 6 is a perspective view of an illustrative stacked, flexible magnetic tape for implementing the structure of FIG. 5.

FIGS. 7 and 8 are plan views of stacked magnetic structures illustrating different corner arrangements thereof.

FIGS. 9 and 10 are cross-sectional views of illustrative embodiments of further, preferred magnetic structures in accordance with the invention.

FIG. 11 is an illustrative embodiment of a magnetic structure applicable to small cathodes in accordance with an important aspect of the invention.

FIG. 12 is a cross-sectional view of a further embodiment of a magnetic structure applicable to small cathodes.

FIG. 13 is a cross-sectional view of an illustrative embodiment of a further, preferred embodiment of the invention.

FIG. 14 illustrates (a) a graph showing the flux distribution established by the structure of FIG. 13 and (b) a cross-sectional view of an illustrative embodiment of a further, preferred embodiment of the invention.

FIG. 15 is a cross-sectional view where the right side portion thereof is an illustrative embodiment of a further, preferred magnetic structure in accordance with the invention and the left side portion thereof is a modified embodiment of the prior art structure illustrated in FIG. 1.

FIGS. 16 and 17 are cross-sectional views of illustrative embodiments of further, preferred magnetic structures in accordance with the invention where the left and right side portions of each Figure illustrate a particular embodiment of the invention.

FIGS. 26, 27 and 28 are cross-sectional views of illustrative embodiments of further magnetic structures in accordance with the invention where the left and right sides of each Figure illustrate a particular embodiment of the invention.

FIG. 29 is a graph showing the flux distribution established by the embodiments of FIG. 28.

DETAILED DESCRIPTION OF THE DIFFERENT EMBODIMENTS OF THE INVENTION

Figure 1:
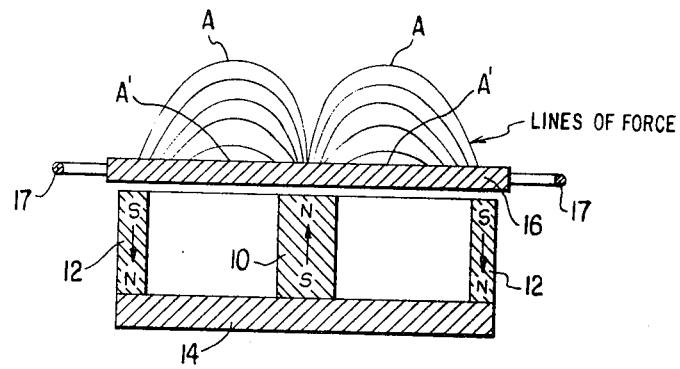
FIGS. 1 and 2 are cross-sectional and perspective views respectively of a prior art planar magnetron sputtering device.

Reference shoud be made to the drawing where like numerals refer to like parts.

Figure 4:
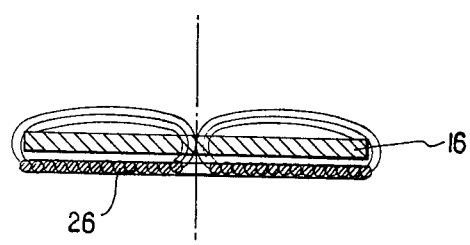
FIG. 4 is a cross-sectional view of an illustrative magnetic structure in accordance with a presently, non-preferred embodiment of the invention.

In FIG. 4 there is illustrated a magnetic structure comprising a flat coil solenoid 26 which was tested in an attempt to provide a magnetic flux, which was more uniformly parallel to the surface of the target 16 than that provided by the FIG. 1 structure. As indicated hereinbefore with respect to FIG. 1, disintegration of the cathode predominantly occurs where the lines of force are substantially parallel to the cathode surface—that is, at regions A'. However, the area over which the lines of force are substantially parallel is rather minimal and thus uneconomical utilization of the cathode results. The FIG. 4 embodiment did generate a desired type of parallel field (the illustration of which is approximate), but the ampere-turns required to generate sufficient magnetic flux (typically over 100 Gauss at ½ inch above the coil) was very high. Accordingly, the flat coil solenoid of FIG. 4 is not considered to be a preferred embodiment of the invention at this time.

Figure 2:
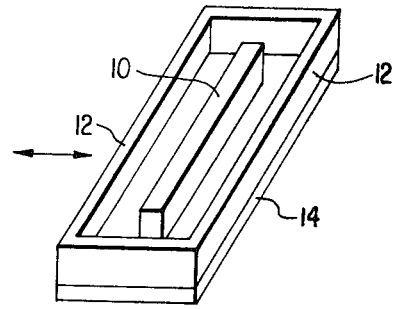
Figure 3:
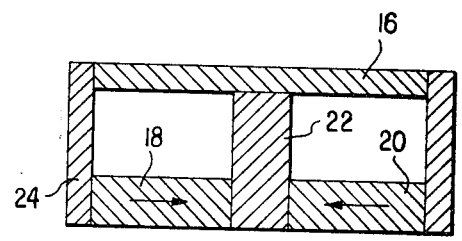
FIG. 3 is a cross-sectional view of another prior art device.

Referring to FIGS. 5 and 6, there is shown an illustrative permanent magnet structure which functionally approximates the FIG. 2 structure, where again the illustrative field is approximate. The structure comprises a plurality of flexible magnetic tapes 28 which are concentrically arranged or stacked to form a flat coil as shown in FIG. 6. Each ring of the coil comprises a strip of the tape where the ends of each strip abut one another as indicated at 30 for the outer ring. Together the strips are substantially equivalent to a solid magnet where the directions of the flux in each magnet are represented by arrows in FIG. 5 and where the north and south poles of this "solid" magnet are as shown, it being understood that the polarities shown are illustrative and may be reversed, if desired. Rather than employing concentric or stacked strips as shown in FIGS. 5 and 6, a single strip can be tightly wound to provide a spiral configuration which is also very effective. Typically the strips of flexible magnetic tape are oriented ferrite impregnated rubber strips 1/16 inch or ⅛ inch thick. Further, rather than tapes, ferrite block magnets (typically 3/16 inch thick) may also be employed to construct a configuration corresponding to that of FIG. 6.

Sputter cathodes magnetically enhanced by the magnetic structures of the present invention possessed superior performance characteristics compared to those enhanced by the conventional FIG. 1 structure. They support extremely high density plasmas, give better than usual target utilization and provide higher power efficiency than conventionally achieved. They need no pole pieces, can be built at lower cost and promise longer maintenance free life time.

The rolled and stacked magnet assemblies differ from the conventional magnetic arrays in that they represent a "solid" magnet, as discussed above, rather than several individual magnets pieced together magnetically via the pole pieces or pole plates. The performance of the resulting cathodes is closely related to this "solid" form—especially in the corners 34 shown in FIGS. 7 and 8. A degree of corner integrity can be readily lost by any gaps between the layers of rubber magnet in the corners. Trying to wind a magnet to best fit a rectangle on the outside and gradually gapping the corners with magnetic material 36 as in FIG. 7 to generate a flattened ellipse in the center will typically result in a much less powerful cathode than will a tight wound flattened ellipse as shown in FIG. 8.

When the rubber strip is used in either a stacked or rolled construction several new factors are present. As indicated above, there is a unique advantage in establishing the "corner integrity" such that the plasma does not suffer corner losses as typically occurs with stacked block angled corners or square corners. Further, the electrical efficiency of the cathode increases—that is, more sputtering per watt-second of power consumed. Improvement is typically sufficient to give 1.5 to 3 times the usual sputter efficiency. There is also a uniquely greater stability to very high voltages and currents and to very low inert gas pressures. Full power operation is also obtained at pressure 10 times lower than usually required.

The power levers that can be supported by these cathodes at 2 microns of argon—or less, exceeds that previously observed by the inventor. Due to limitations of power supply capability and inability to adequately cool the target, the ultimate limitations imposed by the magnetic structures have not been determined. However, it has been observed that two to four times the usually employed power levels are readily attained without suggestion of a break in the E-I curve.

The flexible magnet materials also make possible many structures that would be most difficult and expensive to achieve in any other way. Even the FIG. 1 type of magnet structure can be given improved properties by interweaved stacking of the corners to provide "corner integrity" using the rubber strips. It may also be possible to achieve the corner integrity by use of permeable metal sheets between layers of blocks or strips in the corner regions.

In spite of the improvements effected by the FIG. 5 embodiments, they still suffer from uneven target utliization. Where the lines of flux enter the center line of the target at about 45° or more, there is no erosion of the target. At the outside edge prediction is less certain, for centrifical force seems to overcome any simple angle value. Full 90° is a safe value; however, this makes it possible to develop clamp rings and guards that stop erosion at any desired point, as will be discussed further hereinafter. The lack of erosion in the target center is of special concern due to the great cost of most of the targets. Increasing the area significantly eroded before any point erodes all the way through the target is thus of great importance. Accordingly, the magnetic structure illustrated in FIG. 9 may be employed whereby the magnets 28 are tipped away from the perpendicular orientation shown in FIG. 5. The angle of the magnets with respect to the perpendicular can fall within the 40°-60° range shown in FIG. 9 and preferably this angle should be 50°-55°. Special orientations of the magnets to change the pattern of erosion become quite easy when the flexible magnet system of the present invention is used. As the magnets are tipped toward the center, it is observed that the plasma is affected very little until approximately 40° is reached. At approximately this angle depending upon the geometrics, field strengths, etc., a unique magnetic fused dome structure is formed at the target center line, the illustration of which is approximate. There appears to become but a single line of perpendicular flux where there had previously been about $\frac{1}{2}$-1 inch or more of this. The flux lines branch out of this center line at angles of 45° or less. The result is a unique plasma flow situation where the opposing streams of plasma overlap the center line of the magnetics, providing erosion of the target across its center whereby the uniformity of target erosion may be improved with respect to that of the FIG. 5 embodiment. Although the magnets 28 as shown in FIG. 9 are polarized across the thin dimension thereof, it is to be understood that they may also be polarized along the width thereof—that is, from A to B as shown in FIG. 9.

A particularly preferred embodiment of the invention is illustrated in FIG. 10, this embodiment combining the effects provided by the structures of FIGS. 5 and 9. Accordingly with the embodiments of FIG. 10, the strength of the magnetic field above cathode 16 is enhanced by the perpendicular magnets 28' while the erosion of the target center is enhanced by the tipped magnets 28". Thus, for example, if the cathode has a width of 4 inches to $4\frac{3}{4}$ inches, the extent of magnets 28" on one side of the cathode might be $\frac{1}{2}$ inch to $\frac{3}{4}$ inch, and the extent of magnets 28' might be one inch. To provide a continuous solid structure, a wedge-like insert 30 of magnetically permeable material is preferably disposed between the perpendicular magnets 28' and the tipped magnets 28". As indicated hereinbefore, clamp rings may be provided to stop erosion at the outer edge of the target. Such a ring is shown at 32 in FIG. 10 where the lines of force are perpendicular to the clamp rings. Further, such clamp rings may be useful in positioning the cathode structure of FIG. 10 within the sputtering device.

An attempt was made to construct very small structures corresponding to that of FIG. 1. It was found that at diameters less than about $1\frac{1}{2}$ inches they would not work in that they would not support a stable magnetically enhanced plasma. At sufficiently high voltage they operated as sputter diodes, with no change in behavior noted in the presence or absence of the magnets. Such a structure is shown in FIG. 11 where the structure corresponds to that shown in FIG. 1 but where the distances between the magnets have been substantially decreased to provide a small sputtering device where the cathode typically has a diameter of one inch or less. Such small devices are useful in many applications.

It is thought the problem of center erosion and the problem of very small targets are one and the same. The radius of curvature for the plasma path may be a problem also. The electrons traveling tight corners need very high magnetic fields to keep them from centrifuging away from the cathode. A one inch diameter cathode as shown in FIG. 11 can be built using the most powerful ferrite magnets, although it is to be understood that the cathode of FIG. 11 may be elongated rather than circular if so desired. Under most conditions this will not perform in a magnetically enhanced mode. An iron filings picture which gives an indication of the positions of the lines of force provides an explanation. The trapping dome is very short, pushed down by strangely shaped lines of force from the outer half of the ring magnet. Making the center magnet stronger would help push up the dome, but the strongest commercially available ferrite are now being used. The dome must clear the target surface by at least $\frac{3}{8}$ inch for the magnetic structure to be effective. Because of the quadrupole like form above the magnet, the dome is very tightly defined. Changes in target height of a few thousandths of an inch change this from an unenhanced cathode to a violently effective enhanced one.

It can thus be seen that the small cathode structure of FIG. 11 has the same general quadrupole-like lines of force as the center effective units of FIGS. 9 and 10 obtained by tipping the magnets. As the small cathode field is reduced, or the cathode dimensions increased, the quadrupole effect becomes undetectable. Other magnetic structures may be employed to effect the quadrupole-like lines of force illustrated in FIGS. 9 and 11. Illustrative of such structures would be that of FIG. 12 which is also particularly applicable to small cathodes of either circular or elongated configuration. The magnetic structure includes a pair of C-magnets 40 and 42 in opposing polarity as shown in FIG. 12 where the polarity may be reversed if so desired. A pole piece 44 connects the lower arms of the magnets 40 and 42. A center magnet 46 is disposed between the magnets 40 and 42 where the polarity of the upper pole thereof is opposite that of the upper arms of the C-magnets and where the magnet 46 may be an extension of pole piece 44, if desired.

It is a general teaching of the FIG. 1 structures that the outer pole area should be approximately the same as the inner pole area. In the structures of FIGS. 9, 10 and 11, this teaching has been totally violated. In tipping the magnets in the FIGS. 9 and 10 structures, the lines of force are projected upward from the outer edges, the return path being closed off down the center. In the smaller structure of FIG. 11, the pole areas are loaded $\simeq$10:1 outside to inside. The results are unique.

Placing a steel pole piece in the center and/or around the outside edges of the cathode has almost no effect on the performance of the cathodes of this invention. The unique effects are almost totally caused by the form factor created by the stacking. The form factor can be improved even further (with some loss of flux) through the use of thin magnetic shunts 38 as shown in FIG. 13, which shows thin steel shunts 38 placed just out of magnetic contact with the magnet edge surface. The Gauss level parallel to the target surface (about 3/16 inch above the surface seems to be the most meaningful indication) is shown with and without the shunt in FIG. 14. The presence of the correct thickness (typically 0.005–0.015 inch) and width of shunt provides a significantly wider path of maximum erosion. A heavy shunt destroys the pattern.

Modifying the cross section depth of the magnets can also be used to help shape the parallel Gauss curve and thus the erosion pattern indicated at "x" in FIG. 14. Further, there appears to be many ways the stacked and rolled parallel and tipped magnetic structures of the present invention can be varied to influence target utilization and other performance criteria. Combinations of these effects can also be useful.

It should also be noted that it has been a consistent teaching of the prior art in the magnetically enhanced sputtering field that it was necessary to provide a continuous line of force loop system to provide significant plasma enhancement, the loop, as stated hereinbefore, being defined in the FIG. 1 embodiment above cathode 16 between inner magnet 10 and outer magnet 12. With the flexible strips of the present invention it can be shown that unique and productive configurations can be assembled that are in opposition to this. In fact, unusually wide and uniform sputtering patterns can be obtained in cases where there is intentional disruption of the "race track" type of pattern. By stacking an inch or more thick of long rubber magnet strips, they can be folded, wound and twisted to explore configurations where the ends do not meet end to end. Especially effective is the configuration where an end butts 90° to a side. At such an intersection (of the correct polarities) the plasma forms a 90° corner—full into the corner—and spreads to the full width of the 45° limits of the line of force pattern. This wide plasma seems to be compressed by negotiating corners—as might be predicted from centrifugal force and continuing acceleration in the corners. Such configurations may lead to increased target utilization and refinements far removed from the prior art.

Reference should now be made to FIGS. 15, 16 and 17 which are cross-sectional views directed to further modifications of the present invention which are stable at extremely low pressures and which have an I-E characteristic that exhibits a zero dynamic impedance in a predetermined band of low pressures. FIG. 15 is a modification of the FIG. 1 embodiment of the prior art. In particular, the portion on the right side of the phantom center line of FIG. 15 corresponds to the new zero dynamic impedance embodiment of the present invention while the left side portion corresponds to an embodiment which provides the normally anticipated infinite dynamic impedance of saturation—that is, positive impedance, as will be discussed in more detail hereinafter. Of course, in implementing the present invention, the left side of FIG. 1 would be the mirror image of the right side thereof. In FIG. 15 at the periphery of the magnetic structure, a first plurality of horizontally disposed magnetic strips 50 are disposed on top of a second plurality of horizontally disposed strips 52 where the strips 52 are wider than strips 50. At the center of the magnetic structure a third plurality of horizontally disposed strips 54 are disposed on top of a fourth plurality of strips 56 where the strips 56 are wider than the strips 54. By widening the center magnet at the base thereof, the magnetic field above cathode 16 is made more parallel to and is brought closer to the surface of the cathode than is the case with the prior art cathode of FIG. 1. The widened base of the outer magnet provides a return for the lines of force emanating from the base of the center magnet. Accordingly, the area of target erosion of the FIG. 15 embodiment is increased with respect to that of the FIG. 1 embodiment. Rather than use the stacked strips of tape as shown in FIG. 15, a solid structure as employed in FIG. 1 may also be used in the embodiment of FIG. 15 or the remaining embodiments where, of course, for the FIG. 15 embodiment, the respective bases of magnets 10 and 12 of FIG. 1 would be widened.

The foregoing arrangement contrasts with the left portion of FIG. 15 where the magnets 10 and 12 are simply replaced with respective stacks of horizontally disposed strips 58 and 60 as shown in the Figure. To obtain the advantages of the present invention, it is necessary to widen the lower layers of the magnetic strips as shown in the right portion of FIG. 15.

Referring to FIGS. 16 and 17, there are illustrated four further embodiments of the invention, which are capable of achieving the zero dynamic impedance of the present invention. In FIG. 16, at the left side portion thereof, there is illustrated a first embodiment wherein centrally disposed tipped strips 28" are surrounded by a plurality of horizontally disposed strips 62. In implementing this embodiment, the right side of FIG. 1 would be the mirror image of the left side thereof. Thus, this first embodiment corresponds to that of FIG. 10, where the slanted angle of strips 28" would preferably fall within the 40°–60° range discussed hereinbefore with respect to FIG. 9. Further, insert 30 may also be employed if desired although it is not needed if good contact is made between an edge of magnets 28" and magnets 62. The directions of the flux in magnets 28" and 62 are represented by arrows where the north and south poles are as shown, it being understood that the polarities shown for this embodiment and the other embodiments of this invention are illustrative and may be reversed if desired.

The right side portion of FIG. 16 illustrates a second embodiment capable of producing the zero dynamic impedance of the present invention where the vertically disposed strips 28 correspond to those of FIG. 5 and where they are surrounded by horizontally disposed strips 62. In implementing this embodiment, the left side of FIG. 16 would be the mirror image of the right side thereof.

The left side portion of FIG. 17 is a modification of the left side portion of FIG. 16 where, in implementing this embodiment, the right side of FIG. 17 would be the mirror image of the left side thereof. The slanted or tipped magnets 28''' have a generally rectangular cross-section where the width of the strips at A and B are more narrow than those at C as shown in FIG. 17. A further plurality of vertically disposed strips 64 are disposed between horizontally disposed strips 62 and tipped strips 28'''.

The right side portion of FIG. 17 illustrates a further embodiment where tipped strips 28" are disposed between horizontally disposed strips 62 and vertically disposed strips 66. Again in implementing this embodiment, the left side of FIG. 17 would be the mirror image of the right side thereof.

As can be seen in FIGS. 16 and 17, a common characteristic of all embodiments is the presence of the outer ring of horizontally disposed strips 62. Preferably the outer edge of strips 62 is disposed slightly inward of the outer edge of cathode 16 although other relative placements are permissible. The strips 62 cause the field on the other side of target 16 to be substantially vertical at the approximate periphery thereof. It is thought that this feature is instrumental in achieving the many advantages associated with not only the embodiments of FIGS. 16 and 17 but also those corresponding to FIG. 15. Increased field strength does not seem to be a contributing factor. These advantages will be discussed in detail hereinafter with respect to FIGS. 21 and 22. However, before doing so, certain characteristics of conventional magnetrons will be discussed with respect to FIGS. 18 through 20.

Figure 18:
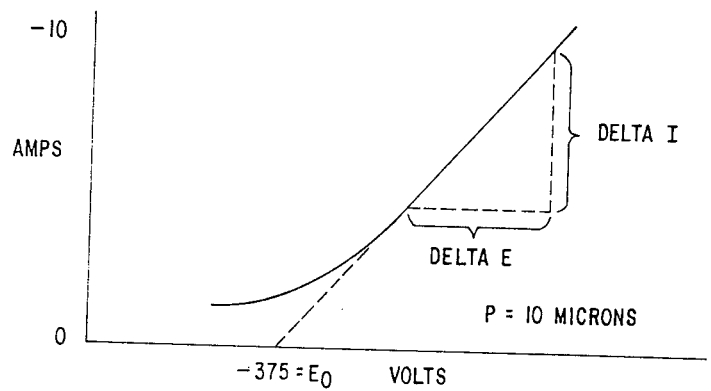
FIG. 18 illustrates a typical current-voltage characteristic for a magnetically enhanced sputter cathode such as that of the embodiment of FIG. 1.

Magnetically enhanced sputter cathodes such as the embodiment of FIG. 1 typically display a current-voltage characteristic such as that shown in FIG. 18. The cathode reaction impedance, Z, may be defined as delta E over delta I at any point along the characteristic. This impedance usually assumes a fixed value above a current of a few amperes. The initiation voltage, $E_o$, may be defined as the zero current intercept of the extrapolated linear portion of the current voltage characteristic.

Figure 19:
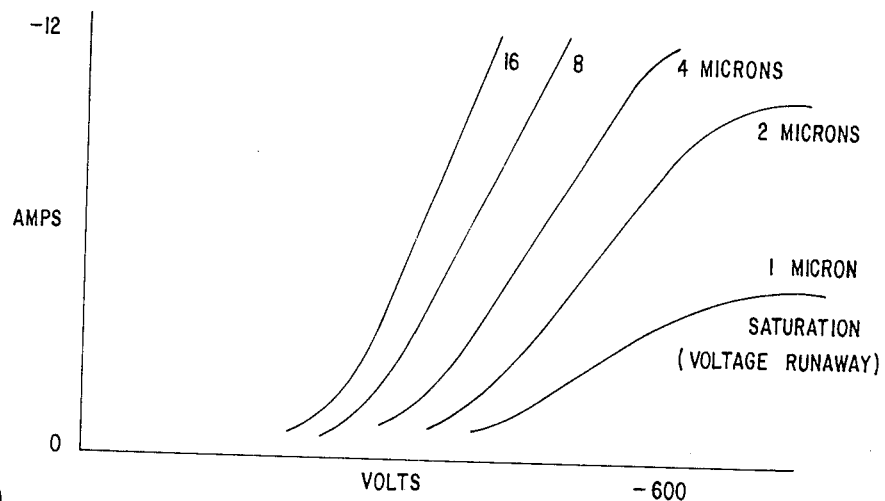
FIG. 19 illustrates a family of current-voltage characteristics corresponding to that of FIG. 18 over a range of pressures.

The family of characteristics over a range of pressures is shown in FIG. 19 for the conventional magnetron. Typically, $Z_p$, the reaction impedance that is constant at a given pressure changes with pressure, becoming larger at lower pressures. The characteristic curves start to break at high power as the pressure is reduced. This is a strong function of magnetic quality, both field strength and corner integrity. With a good magnetic structure, some break will start to occur in the 2 micron argon pressure characteristic. These cathodes can sometimes be operated at pressures as low as one micron, but starting becomes difficult, and the discharge will sometimes pop out. The lower pressure characteristics lean over or break to show a saturation.

Figure 20:
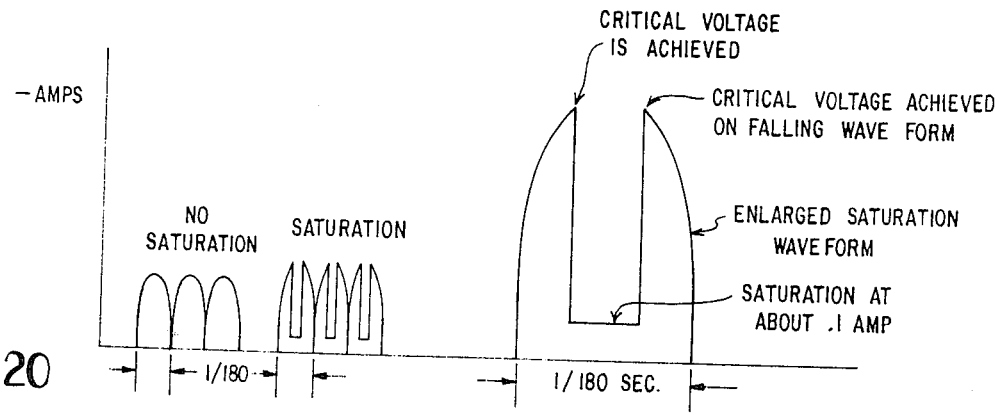
FIG. 20 illustrates current waveforms associated with the characteristics of FIGS. 18 and 19.

The current wave form assumes a most unexpected form, as shown in FIG. 20. The shape of the current peaks at low power is a function of the three phase power. However, when the voltage exceeds some critical value which is a function of many factors, the current drops to a very low value, typically a small fraction of an ampere. This is probably the raw electron emission from the target surface. The mechanism of this current loss is not known for certain, but sputtering stops during this period. As soon as the voltage drops below this critical value the current starts again, and follows the wave form as before.

Figure 21:
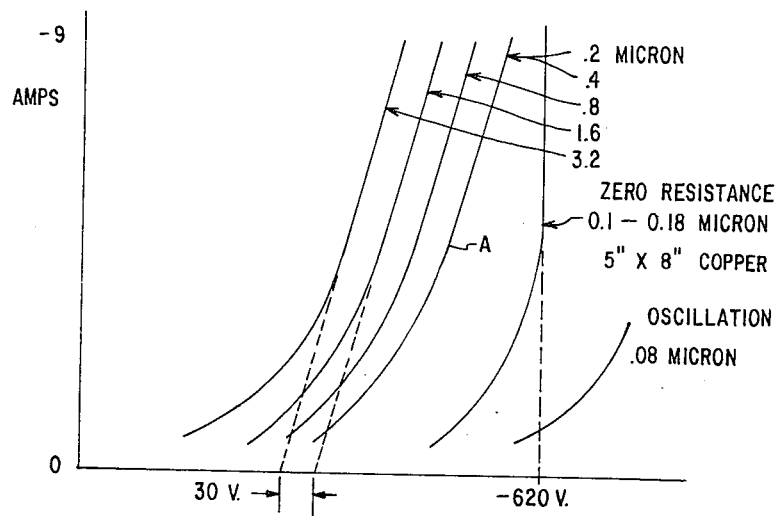
FIG. 21 illustrates a family of current-voltage characteristics over a range of pressures typical of the magnetic structures of FIGS. 15–17.

Characteristics typical of the new cathode magnetic structures of FIGS. 15, 16 and 17 are shown in FIG. 21. Several very interesting differences become obvious. The characteristic is stable to extremely low pressures. A factor of 10× lower pressures becomes very practical. This has many meaningful advantages. Sticking is better. Target to substrate distance becomes a less critical factor. Good sticking has been obtained at 18 inches. Also this expanded pressure range makes it possible to measure and control the pressure with an ionization gauge, rather than the conventional thermocouple gauge. This gives better sensitivity, better repeatability, and much faster response. In addition, most pumping systems, such as that diagrammatically indicated at 68 in FIG. 16, can operate under an argon load without interposing a baffle, or valve restriction at this decreased value. This larger pumping speed gives better impurity removal and more simple system design. Further, there is reduced argon (or other inert gas) entrapment in the coating. Because of the order-of-magnitude decrease in the operating argon pressure over the conventional magnetron, there should be an equivalent decrease in entrapment. The entrapment proves to be even less than that, however, due to the increased coating particle energy resulting from fewer enroute collisions. Thus, as stated above, the sticking is also improved due to this same mechanism. Rate effects, as will be further discussed hereinafter, are also improved where a factor of four times the conventionally obtained rates seems feasible. In this new mode of operation, it is also noted that the erosion pattern spreads across the center of the target, providing increased area of target erosion. This rate in the center is less than in the main ring, but does represent significant improvement.

Figure 22:
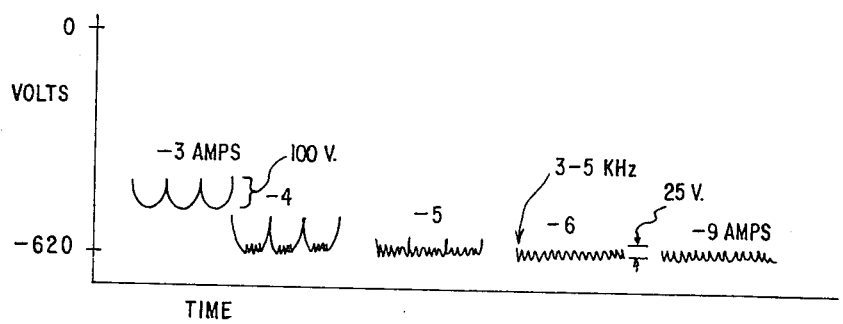
FIG. 22 illustrates various voltage ripple waveforms which occur as the zero impedance portion of the characteristic curves of FIG. 21 is entered.

It is noted that $Z_p$ tends to be constant with the structures of FIGS. 15, 16 and 17, independent of pressure over a wide range of pressure. This suggests that the mechanism of the cathode reaction is not changing over this range. The $E_o$ change for each doubling of pressure is constant at about 30 volts over a wide range of pressures. Below about 0.5 microns $E_o$ stops changing, putting the 0.2 micron characteristic on top of the 0.4 micron characteristic as indicated by curve A of FIG. 21. At a pressure of about 0.18 microns, a new effect occurs in the characteristic. It starts to break upward—just the opposite of saturation. Thus, a vertical characteristic, $Z_p=0$, occurs. This does not degenerate into an arc, in that the critical voltage is needed to sustain the low impedance reaction. It is thought this means that at the critical voltage a state is achieved in which the reaction generates as much of the plasma contents as is used. Thus, no voltage drop is involved, and current control while maintaining the critical voltage becomes the new requirement on the power supply. Operation down to 0.07 microns has been achieved, but appreciable currents at these pressures are presently blocked by rather major oscillations in the current and voltage. The voltage ripple is shown in FIG. 22 as the zero impedance portion of the characteristic is entered.

A most important characteristic of the new cathode structures of FIGS. 15, 16 and 17 is a very high sputter rate. Rates at all power levels appear to be enhanced by 50 to 100%. In the zero impedance mode the rates are further enhanced to give as much as 400% of the conventional rate at the same power level. In the lower pressure range there appears to be a greater diffusivity of the plasma, resulting in better target utilization.

Figure 23:
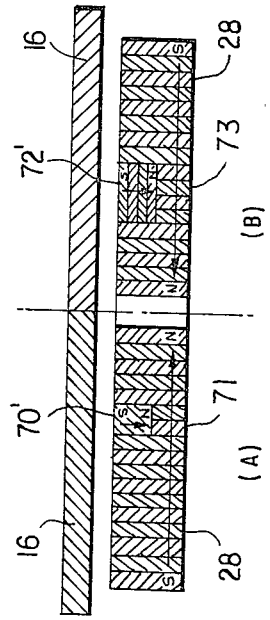
FIG. 23 corresponds to the embodiment of FIG. 13 where the left side thereof illustrates field shaping which occurs with a shunt while the right side illustrates the field which results without the shunt.

In FIGS. 13 and 14, iron shunt 38 is employed as a field shaping expedient. This magnetic conductor provides a medium through which some of the lines of force from a coil 28 of magnetic source material are shunted, as illustrated in FIG. 23 where the left side of the FIG. approximately illustrates the field shaping which occurs with shunt 38 and the right side the field which results without the shunt. As can be seen, this shunting action also bends or deflects some of the remaining lines of force, bringing them into lower, more parallel (to the target surface) position above the target, enhancing and rendering more uniform the plasma layer in the sputtering process. However, since shunt 38 removes some of the lines of force from above the target, it is preferable to employ means which provide the bending action but which do not significantly decrease the flux density.

Figure 24:
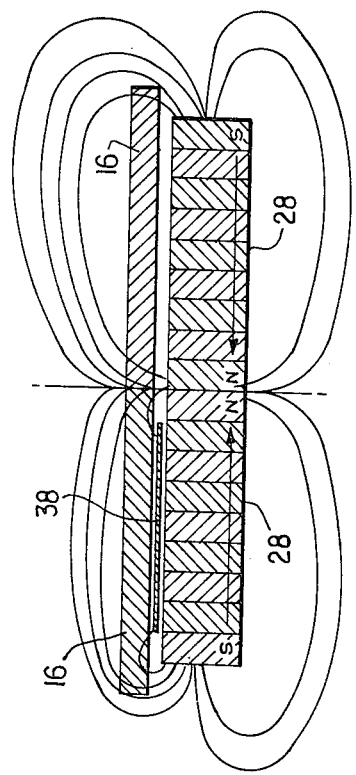
FIG. 24 is a cross-sectional view of illustrative embodiments of further, preferred magnetic structures in accordance with the invention where the left and right sides thereof illustrate particular embodiments of the invention.

There are many magnetic structural configurations that can provide some degree of shaping such as those shown in FIG. 24 at A and B. Magnets perpendicular to the fundamental coils or stacks 28 are shown where in the embodiment illustrated at A a ferrite block magnet 70 is employed and at B a coil or stack 72 of ferrite impregnated rubber strips is employed. The block magnet 70 should be sufficiently strong so that it is not demagnetized by stack 28. Typical of suitable block magnets are 1/4"×1" thick ferrite magnets made by Arnold Magnetics, Inc. or Crucible Iron and Steel Co. The ferrite impregnated strips of stack 72 may be of the same type employed in stack 28. Typical of suitable strips are 1/2" wide ferrite impregnated tapes (such as PL-1.4 H made by Minnesota Mining and Manufacturing Co.). The magnet 70 and stack 72 pull down the lines of force issuing from the center of fundamental stack 28 as indicated at FIG. 24B. This action can establish the needed 45° relationship between the lines of force and the target surface, as described hereinbefore, very close to the center of the magnet assembly. Magnets 70 and 72 are more effective than the edges of the individual magnets in fundamental stack 28 due to their projection angle and greater single polarity width.

The similarity between the embodiments of FIGS. 5 and 24 should be noted, the basic difference, of course, being the presence of magnets 70 and 72. The fundamental stack 28 of FIG. 5 establishes a flux therein which is substantially parallel to the lower surface of the target. When a relatively large cathode 16 is employed, the strength of the field and the parallelism thereof with respect to the target are adequate to achieve uniform target erosion and the other advantages described hereinbefore. However, when the size of the cathode is reduced to 4½ inches or less (which may be the diameter of a circular target or the width from C to D of a generally rectangular or oblong target as indicated in FIG. 5), the field produced by the magnetic structure of FIG. 5 tends to be less parallel to the target surface than is preferred, whereby the erosion is less uniform. Since practical target sizes tend to be 4½ inches or less, it is thus preferable to modify the FIG. 5 structure in such a way as to effect the desired field shaping (target parallelism). Such modifications are effected by the magnetic field deflectors 38, 70 and 72 of the embodiments of FIGS. 23 and 24, as discussed above. The embodiment illustrated at B in FIG. 24 can also play an important role in shaping about the corners, etc.

Figure 25:
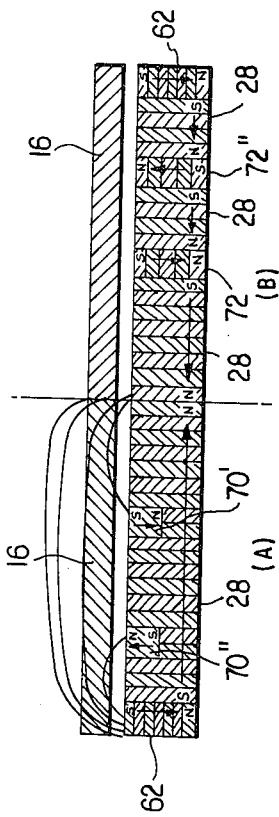
FIG. 25 is a cross-sectional view of illustrative embodiments of further, preferred magnetic structures in accordance with the invention where the left and right sides thereof are respective modifications of the left and right sides of FIG. 24.

When the magnetic field deflectors 70 and 72 of FIG. 24 are employed, a portion of the fundamental field established by stack 28 is displaced in that none is generated in the fundamental direction by the perpendicular deflectors 70 and 72. In cases where the maximum fundamental field is needed, it is expedient to continue the fundamental field source 28 beneath the deflector magnets as shown in FIG. 25 at 71 and 73. This provides the full series magnet for the fundamental parallel field.

Figure 26:
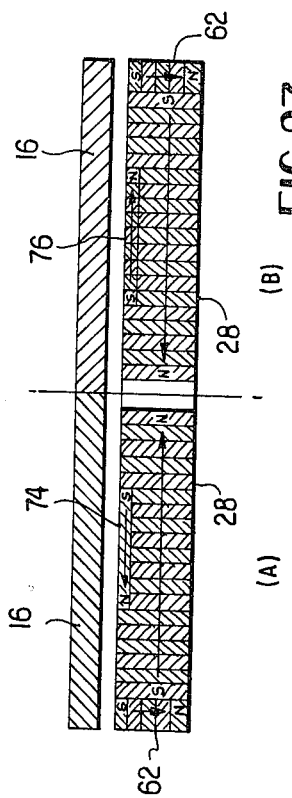

The magnetic deflectors 70, 72, 70' and 72' are intended for maximization of center target utilization. When the outer stacks of magnets such as magnets 62 of FIGS. 16 and 17 are employed to provide a sharply defined outer edge for the erosion of the target, it is preferable to use outer deflectors 70" and 72" also as shown in FIG. 26. All of the principles related to the inner set 70, 72, 70' and 72' apply also to the outer ones 70" and 72". This thereby extends erosion uniformity both toward the center and toward the outside of the target 16 where further deflectors, in addition to deflectors 70, 72, 70' and 72', may be employed if so desired.

Figure 27:
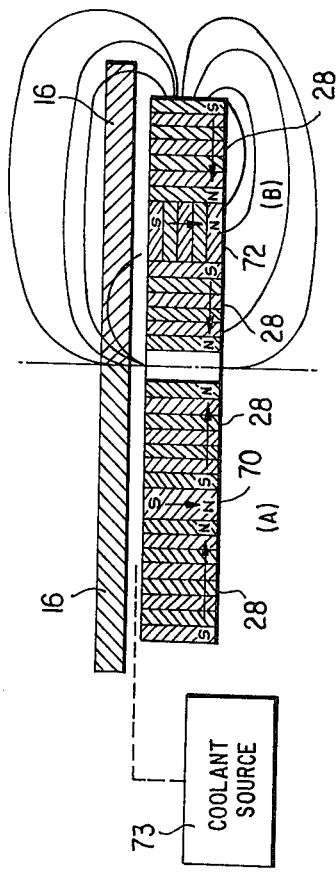

It is also possible, as shown in FIG. 27 to use parallel deflectors 74 and 76. Several aspects of the design criteria for these are more critical than for the perpendicular types of FIGS. 24-26. Basically these are like the shunt system of FIG. 13, but more powerful.

The embodiments of FIGS. 24-27 are particularly powerful although they are somewhat costly for some routine sputter applications. Thus, where less power at the lowest pressures is required, the magnets 70, 72, 70', 72', 72", 74 and 76 may be omitted from the embodiments of FIGS. 24-27 in accordance with a further aspect of this invention. The foregoing is illustrated in FIG. 28 where the left side thereof corresponds to the embodiment shown at B in FIG. 24 with an outer perpendicular ring 62 and the right side thereof has an open slot 78 corresponding to magnetic stack 72 where the slot may typically be about 1/2" thick. The latter embodiment is less pressure critical for optimization of target utilization than is the embodiments of FIGS. 24-27 although there is a slight decrease in power/sputter efficiency.

The position of slot or gap 78 controls the shape of the top of the parallel field above magnet 28 as does the position of ring 72, this being illustrated in FIG. 29 where the left and right sides thereof respectively correspond to the left and right side embodiments of FIG. 28. However, in the embodiment of FIG. 28A, the optimum location of ring 72 is such that the stacks or rings 28 on opposite sides thereof are approximately equal in length along a line from the center to the periphery of the magnetics while in the embodiment of FIG. 28B, the stack or ring 28 on the inside of slot 78 is optimally about twice as long as the stack or ring 28 on the outside of the slot.

It should also be noted slot 78 need not completely interrupt stack 28 but may only partially interrupt it in a manner analogous to that of the embodiment of FIG. 25. Further, there may be provided two or more complete or partial slots in a manner analogous to FIG. 26.

An iron ring or a non-magnetic ring (plastic or copper, for example) (not shown) may also be employed in slot(s) 78 in lieu of ring 72 where typically the slot width would be smaller if it contained a non-magnetic ring. An iron ring provides some slight advantage over an open slot 78, as indicated in FIG. 29B. Further, the iron ring gives slightly more power to the outer rings of the magnetic structure than does open slot 78.

By increasing the number of lines of force that have an angle of 45° or less at the center of the target, the magnetic structures of the present invention satisfy a first condition for obtaining substantially uniform erosion of target 16. A second condition for obtaining erosion is that the strength of the magnetic field approximately parallel to and at least 3/8 inch above the target surface should preferably be at least about 80 gauss. In particular, the two conditions of (a) lines of force having a 45° angle or less with respect to the target and (b) 80 gauss parallel field strength at least 3/8 inch above the target should both be satisfied over as much of the target surface as possible to provide uniformity of target erosion. The various embodiments of the present invention satisfy the above requirements with varying degrees of success, the embodiments of FIG. 25 at A and B and of FIG. 26 at A appearing at this time to be the most successful, although it is to be understood that the embodiments of FIG. 25 with an outside vertical stack 62 should also be successful as would be the slotted (whether open or not) embodiments represented by FIG. 28B for many routine sputter applications.

Figure 30:
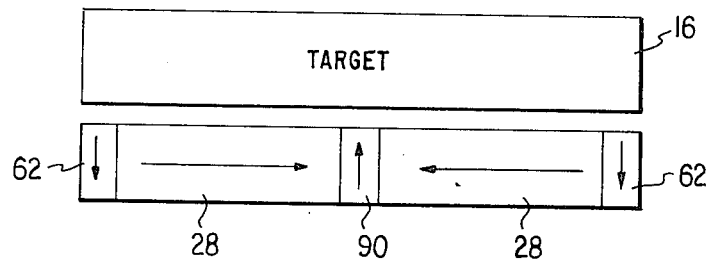
FIG. 30 is a cross-sectional view of an illustrative embodiment of the invention suitable for sputter thicker targets used in industrial applications.

Reference should be made to FIG. 30 which shows an illustrative embodiment for sputtering targets of about one inch. With the materials employed in the present invention for magnet construction and especially the ferrite impregnated plastic or rubber materials (such as PL-1.4 H made by Minnesota Mining and Manufacturing Co.), many of the embodiments discussed hereinbefore are typically capable of operating with targets up to ½ inch in thickness. In most applications this is sufficient. However, in heavier industrial coating operations such as those in glass, auto parts, plastic film, and so forth, the cost of the target change downtime is of sufficient concern that targets of one inch thickness are desired.

To erode a thicker target, fields must be provided approaching parallel above the target surface by at least ⅜ inch at levels exceeding about 80 gauss—just as for the thinner targeted embodiments discussed above. Forcing fields of this magnitude through the greater thickness of target involves more substantial magnets, though the same principles apply. It has been observed that the addition of a magnet 90 perpendicular to target 16 at its center can significantly increase the field at this height parallel to the target surface. It should be noted that this tends to widen the center area in which lines of force pass into the target at greater than 45°. This decreases the percentage of target than can be sputtered away and can reduce the sputter effectiveness of the discharge power. Thus, this approach to thick target sputtering is a compromise in which one parameter is traded for another.

Figure 31:
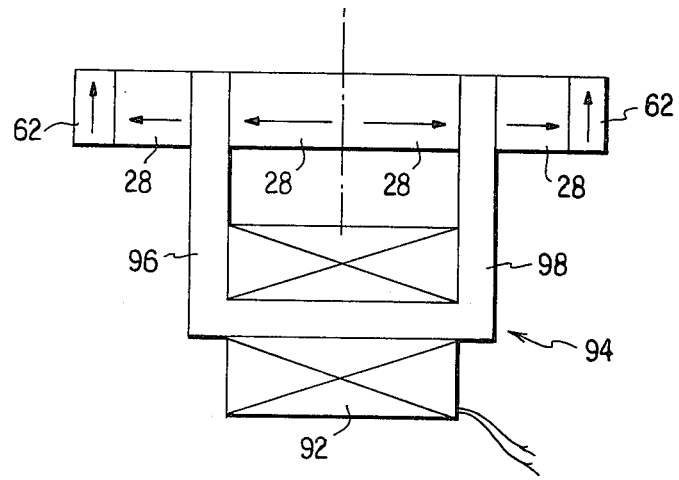
FIG. 31 is a cross-sectional view of an illustrative embodiment of the invention for magnetically shifting plasma across a sputtering surface.

Reference should be made to FIG. 31 which shows an illustrative embodiment for increasing the width and uniformity of the erosion pattern on magnetically enhanced sputter cathodes. Because of the high voltages on the cathode structure, it is desirable that there be a minimum of complex operating structure. The width and shape of the erosion patterns are a function of magnetic field shapes and strengths as well as the field position relative to the target surface. These parameters may be simultaneously varied without mechanical intervention by combining the embodiments described hereinbefore with a relatively small electromagnet 94 which only provides a changing aspect to the overall field. Electromagnet 94 should be applied with care on alnico magnet systems, in that their strength can be degraded if the field modification is too severe. FIG. 31 shows a cross section of a rubber magnetics system 28 and 62 with auxiliary electromagnet 94. The magnetic field at the two areas of contact between the fixed magnets 28 and the steel frame 96, 98 are the same. Thus, the effect on the fixed field should be very minimal. When current is passed through electromagnet coil 92, the two legs 96 and 98 of the frame are forced to different magnetic polarities. This upsets the balance of field and shifts the mechanical position of the center of the magnetic field. The center line of the field on the target may receive relatively little erosion. Moving this line permits enhanced erosion to occur across the center of the target, significantly increasing the percentage of utilization of the target. Use of AC on the electromagnet oscillates the center automatically from side to side. Correct design of the coil makes it possible to use a fixed voltage transformer to drive the coil. Preferably the waveshape of the signal should be rectangular or square and the frequency may be about 60 hz although a rather broad range of frequencies may be employed.

As indicated hereinbefore, large voltages and currents can be applied to the sputtering device of the present invention at low pressures. Hence, contaminants and the like can be readily pumped out and yet a high sputter rate is available. A feature which has been observed with respect to the sputtering device is the large ratio of circulatory Hall effect current with respect to the discharge current passing between the anode and cathode. The Hall effect circulatory current results from the closed plasma loop, which may be generated by the magnetic structure of FIG. 6, for example, the plasma loop extending over the sputtering surface in a well known manner as described, for example, in aforementioned U.S. Pat. No. 3,878,085. The circulatory current circulates around the plasma loop and is primarily due to the more mobile ionizing electrons. Thus, the large circulatory current obtainable with the present invention is indicative of the presence of a large number of ionizing electrons to thereby provide high sputtering rates at low pressures.

The discharge current passing between the anode and cathode is that which conventionally passes through the external circuit connected across these two electrodes. Circulatory currents five to one hundred times greater than the discharge current have been observed. It appears that the strength of the magnetic field generated by the circulatory current approximates that of the field generated by the magnetic structures of the present invention, this being a further indication of the magnitude of this current. It further appears the magnetic field generated by the circulatory current may tend to pinch the closed loop plasma into a thin, intense, ribbon-like sheet although it is not apparent to what extent this pinch effect is achieved. It may be that this effect is instrumental in achieving the high sputter rates at low pressures obtainable with the present invention although there is no intent to be limited to a particular theory of operation.

Several factors or combinations thereof are thought to provide the above improved performance features of the present invention. One factor is that of enhancing the erosion of the target across the width thereof—that is, in the direction of the lines of force over the target as generated by the various embodiments of this invention. Ideally the width of uniform target erosion corresponds to the width of the closed loop plasma path discussed above. In addition to uniformity of target erosion across the width of the closed loop path, uniformity of the magnetic field around the closed loop path (including, in particular, the non-linear (curved or 90° turn, for example) portions of the path) is also desirable. Yet another factor is the maintenance of a sufficient magnetic field strength over the target to provide electron entrapment. Another factor is confinement of the plasma to the closed loop where the magnetic lines of force may or may not pass through the target layer of sputtering material during both their exit from and return to the magnetic structure.

Various features of the magnetic structures described hereinbefore are instrumental in implementing the various factors described above or combinations thereof. Thus, with respect to the provision of more parallel magnetic lines of force with respect to the sputtering surface, the embodiment of FIG. 5 is available for larger targets although, of course, the other embodiments of the invention may also be employed. For smaller, more conventional targets, the field deflecting means described hereinbefore with respect to FIGS. 13 and 23-28 are preferred. Typically, these embodiments include at least one magnet (stack 28, for example) which establishes the generally parallel field to the sputtering surface. This field may be rendered more parallel with respect to the sputtering surface by additional magnets in magnetic circuit with (a) the first magnet 28, such as additional magnets 70, 72, 70', 72', etc., where magnets 70 and 72 completely interrupt the flux through stack 28 while magnets 70' and 72' only partially interrupt this flux and (b) the lines of force over the target surface. Further, slot 78, which may be open or which may contain an appropriate insert, may also act as means for effecting the requisite field deflection to render the lines of force more parallel to the target surface.

Uniformity of the magnetic field above the sputtering surface around the closed loop at least in the central portion of the field may be obtained by the use of the flexible magnetic structures illustrated in FIGS. 5 and 8. Illustrative of such flexible magnetic structures are the magnetic tape embodiments described hereinbefore.

The desired strength of the magnetic field (typically a parallel field strength of at least 80 gauss at least $\frac{3}{8}$ inch above the sputtering surface) is preferably obtained with the ferrite magnets described hereinbefore where the rubber or plastic tapes impregnated with ferrite particles are advantageous. The presence of these particles, which are capable of producing a very strong magnetic field, in a low permeability binder such as rubber or plastic, is apparently advantageous in generating fields having the requisite strength, although it is to be understood that other ferrite magnets may be employed as may be appropriate ferromagnetic magnets such as alnico magnets.

In order to confine the plasma to its closed loop path and thus prevent erosion from extending beyond the target (or cathode) edge, magnet 62 of FIGS. 15-17, 26-28, 30 and 31 may be employed for achieving this feature of the invention. In the above embodiment the south pole, for example, of magnet 62 is adjacent that of magnet 28. Hence, the close justaposition of these like poles is a further factor in promoting parallelism of the lines of force to the very edge of the plasma path, at which point the lines of force are directed substantially perpendicularly through the target edge to thereby limit further erosion thereof. Hence, ideally the lines of force should be rectangular in configuration (as opposed to curved) over the sputtering surface and the field shaping techniques of the present invention have been so utilized as to approach this ideal with varying degrees of success while at the same time providing sufficient field strength over the target.

With further respect to magnets 28 and 62 (and the other magnets described hereinbefore), it is emphasized that both of these members are magnets as opposed to members made of mon-magnetized, magnetically permeable material such as iron pole pieces frequently used in magnetic structures to direct lines of force. Such pole pieces and the like do not effect the requisite field shaping and/or generate the requisite field strength as is obtained by the present invention. Further, the direction of the flux in fundamental magnet 28 is preferably inclined at an angle with respect to the flux in magnets 28", 62, 70, 71', etc. Hence, the desired field shaping depends to a certain extent on the respective inclinations of the fluxes in the different magnets as well as their respective strengths. Preferably, the flux in magnet 28 is parallel to the target surface and those in the field shaping magnets is at an angle of 90° with respect to that in magnet 28, although, as in FIG. 27, the flux in the field shaping magnet can be opposite to that in magnet 28. Further, the strength of the field shaping magnets should be such that they are not de-magnetized by fundamental magnet 28 or vice versa. Also, with respect to the field shaping means, various combinations of magnets, slots, iron rings, etc. may be employed if so desired. Further, although permanent magnets are preferred for establishing the fundamental field and for shaping it, electromagnets may also be employed as indicated, for example, in FIG. 4.

As indicated hereinbefore, the magnetic structures of the present invention may be employed with planar cathodes which are circular or oblong. Oblong cathodes may be rectangular, elliptical or oval. Also, the planar cathode may be annular. Further, the planar cathode may include non-linear portions such as the concave portions shown in the cathodes of FIGS. 5 and 7 of aforementioned U.S. Pat. No. 3,878,085. In addition to planar cathodes, cylindrical, conical, closed belt, etc. cathodes may also be employed. Also, as the cathode is sputtered, there will be a tendency for it to become concave. Nevertheless, the cathode may still be considered planar, cylindrical or whatever its original shape was. Further, contoured surfaces may be imparted to the cathode so that it is thicker in areas of greatest expected erosion whereby the target will sputter relatively uniformly. Again, such a cathode is to be considered planar, cylindrical, etc. depending upon its general configuration prior to sputtering thereof.

The target material to be sputtered may or may not be the cathode of the device. If not, it may be clamped to the cathode by a clamp similar to clamp 32 of FIG. 10. Clamp 32 may also be employed to secure the cathode to the magnetic structure when the cathode and target are one and the same. When the target is distinct from the cathode, it may or may not be co-extensive therewith. If the target is smaller than the cathode, the magnetic lines of force may return to the magnetic structure through the cathode rather than the target. As long as the lines of force are substantially perpendicular to the cathode where they pass therethrough, sputtering of the cathode is minimized.

As stated hereinbefore with respect to FIG. 10, the lines of force can be returned through clamp 32, the lines being substantially perpendicular to the surface thereof to thereby minimize erosion thereof. Typically, clamp 32 (whether it is used to clamp the target to the cathode or to position the cathode within the magnetic structure) is in electrical contact with and connected to the cathode although it is not a part of the cathode structure. In fact, member 32 may be slightly spaced from the cathode so that the lines of force return perpendicularly therethrough and yet little, if any, plasma escapes betweem member 32 and the cathode since the spacing is so small that a plasma cannot be formed therebetween. The member 32 can thus provide a path for return of the magnetic lines of force and further prevent lines of force from returning to the anode which would permit electrons to escape from the plasma. Further, spaced member 32 may be biased somewhat negatively with respect to the cathode to effect repulsion of electrons therefrom and maintain electron entrapment.

Regarding the anode referred to hereinbefore, it is usually so-called because sputtering systems are typically self-rectifying when an AC potential is applied. Hence, although the term anode is employed in the following claims, it is to be understood that it may be any other equivalent electrode in the system. Further, the anode can be the container wall of the sputtering device. DC, low frequency AC (60 Hz, for example) or industrial radio frequencies, such as 13.56 MHz or 27.12 MHz, may be applied across the anode and cathode. To effect RF isolation, the anode is almost always the container wall when these high frequencies are employed although it is quite often employed as the anode when DC is employed.

As to the gas employed in the system, it may be either active or inert depending upon the type of sputtered layer desired.

It should be further noted that the principles of the present invention can be applied to sputter etching.

What is claimed is:

1. A magnetically enhanced sputtering device comprising:
   a cathode, at least a portion of which is provided with a planar sputtering surface;
   an anode spaced from said cathode for establishing a discharge current therebetween; and
   permanent magnet means for establishing a closed loop magnetic field where at least some of the lines of force of the field extend parallel to and over said planar sputtering surface, said permanent magnet means further establishing a closed plasma loop path over said planar sputtering surface thereby providing a Hall effect current which circulates around the closed plasma loop path, said permanent magnet means including means for causing the magnitude of the circulating current to be at least approximately five times as great as that of said discharge current.

2. A sputtering device as in claim 1 including means for shaping said magnetic field at least along the direction of said lines of force.

3. A sputtering device as in claim 2 where said field shaping means includes field deflecting means for rendering said lines of force more parallel to said sputtering surface to thereby enhance uniformity of erosion of the sputtering surface at least in the direction of the lines of force.

4. A sputtering device as in claims 2 or 3 where said field shaping means includes erosion limiting means for causing the lines of force to be substantially perpendicular to an edge of the sputtering surface to thereby substantially limit erosion of the sputtering surface beyond said edge.

5. A magnetically enhanced sputtering device comprising
   a cathode, at least a portion of which is provided with a sputtering surface having a central portion;
   an anode spaced from said cathode for establishing an electric field therebetween; and
   magnet means for establishing a magnetic field where the lines of force thereof extend over and pass through said sputtering surface at said central portion thereof, said magnet means including means for causing the majority of the lines of force to pass through said central portion of the sputtering surface at angles of 45° or less with respect to said sputtering surface, said last-mentioned means being disposed on the side of said cathode opposite said sputtering surface where the flux therein extends substantially parallel to said sputtering surface.

6. A sputtering device as in claim 5 where substantially all of said magnetic lines of force pass through said central portions of the sputtering surface at angles of 45° or less.

7. A sputtering device as in claim 5 including means for shaping said magnetic field at least along the direction of said lines of force.

8. A sputtering device as in claim 7 where said field shaping means includes field deflecting means for rendering said lines of force more parallel to said sputtering surface to thereby enhance uniformity of erosion of the sputtering surface at least in the direction of the lines of force.

9. A sputtering device as in claims 7 or 8 where said field shaping means includes erosion limiting means for causing the lines of force to be substantially perpendicular to an edge of the sputtering surface to thereby substantially limit erosion of the sputtering surface beyond said edge.

10. A magnetically enhanced sputtering device as in claim 5 including
    magnetic shifting means disposed on the side of said cathode opposite said sputtering surface for shifting said magnetic lines of force over said sputtering surface.

11. A sputtering device as in claim 10 where at least a portion of said cathode is symmetrically disposed about a center line perpendicular to said sputtering surface and where the said lines of force of said magnet means pass through the sputtering surface in the vicinity of said center line and where said magnetic shifting means includes an electromagnet having a pair of legs the ends of which are respectively disposed on opposite sides of said center line on the side of said cathode opposite said sputtering surface.

12. A magnetically enhanced sputtering device comprising
    a cathode, at least a portion of which is provided with a planar sputtering surface;
    an electrode spaced from said cathode for establishing an electric field therebetween;
    magnet means for establishing a magnetic field where at least some of the lines of force of the field extend over said sputtering surface; and
    magnetic field shaping means for rendering said lines of force more parallel to said planar sputtering surface than what they would be in the absence of said field shaping means to thereby enhance uniformity of erosion of said sputtering surface at least in the direction of said lines of force.

13. A sputtering device as in claim 12 where said field shaping means deflects said lines of force toward said sputtering surface so that each is parallel to said sputtering surface along at least a portion thereof, said portion being longer that what it would be in the absence of said field deflecting means to thereby enhance uniformity of erosion of said sputtering surface at least in the direction of said lines of force.

14. A sputtering device as in claims 12 or 13 including means for causing a substantial number of said lines of force to be approximately perpendicular to an edge of said sputtering surface and thereby substantially prevent erosion of the sputtering surface beyond said edge.

15. A sputtering device as in claim 14 where said lines of force over said sputtering surface pass through at least one predetermined portion of the sputtering surface other than said edge.

16. A sputtering device as in claim 15 where said field shaping means includes further means for rendering said lines of force more parallel to said sputtering surface so that uniformity of erosion of the sputtering surface is enhanced in the direction of said lines of force toward both said one portion of the sputtering surface and said edge thereof.

17. A sputtering device as in claim 16 where said one portion of the sputtering surface is centrally located.

18. A magnetically enhanced sputering device comprising a cathode, at least a portion of which is provided with a planar sputtering surface;

an anode spaced from said cathode for establishing an electric field therebetween;

first magnet means for establishing a magnetic field where at least some of the lines of force of the field extend parallel to and over said planar sputtering surface; and field shaping means for shaping said magnetic field, said field shaping means comprising a second magnet means in a magnetic circuit path which includes said first magnet means and said lines of force over the planar sputtering surface and where the flux in said second magnet means is inclined at an angle with respect to the flux in the first magnet means.

19. A sputtering device as in claim 18 where said second magnet means is disposed adjacent one of the ends of said first magnet means.

20. A sputtering device as in claim 19 where said second magnet means includes means for causing said lines of force to be substantially perpendicular to an edge of said sputtering surface to substantially prevent erosion thereof beyond said edge.

21. A sputtering device as in claim 19 where the sputtering surface layer is at least about one inch thick and where said second magnet means includes means for causing the strength of said magnet field above the sputtering surface to be sufficient to entrap electrons thereover to thereby effect efficient sputtering of said layer.

22. A sputtering device as in claim 18 where said second magnet means is disposed between the ends of said first magnet means so that the flux in the first magnet means is at least partially interrupted by said second magnet means, said second magnet means including means for rendering said lines of force more parallel to said sputtering surface than what they would be in the absence of said second magnet means.

23. A magnetically enhanced sputtering device comprising a cathode, at least a portion of which is provided with a planar sputtering surface;

an anode spaced from said cathode for establishing an electric field therebetween; and first magnet means for establishing a magnetic field where at least some of the lines of force of the field extend parallel to and over said sputtering surface, said first magnet means being disposed on the side of said cathode opposite said sputtering surface and extending along a line substantially parallel to the planar sputtering surface where the flux in said first magnet means extends from a first pole thereof to a second pole thereof; and second magnet means for shaping said magnetic field, said second magnet being substantially aligned with respect to said first magnet means along said line parallel to the planar sputtering surface where the flux in said second magnet means is inclined at an angle with respect to the flux in said first magnet means.

24. A sputtering device as in claim 23 where said flux in the first magnet means extends along said line substantially parallel to said sputtering surface.

25. A sputtering device as in claim 24 where said second magnet means is disposed adjacent one of said poles of the first magnet means.

26. A sputtering device as in claim 25 where the flux in said second magnet means is perpendicular with respect to the flux in said first magnet means.

27. A sputtering device as in claims 25 or 26 where the flux in said second magnet means extends from a first pole to a second pole thereof and where said one pole of the first magnet means is adjacent at least the pole of like polarity of said second magnet means.

28. A sputtering device as in claim 27 where said one pole of the first magnet means is adjacent both poles of said second magnet means.

29. A sputtering device as in claims 25 or 26 including a further magnet means disposed adjacent the other of said poles of the first magnet means.

30. A sputtering device as in claim 29 where said second magnet means has a substantially closed loop configuration.

31. A sputtering device as in claim 30 where said further magnet means is disposed within the said second magnet means.

32. A sputtering device as in claim 30 where said first magnet means has a substantially closed loop configuration disposed within said second magnet means.

33. A sputtering device as in claim 32 where said further magnet means is disposed within said first and second magnet means.

34. A sputtering device as in claim 29 where the flux direction in said further magnet means is parallel and opposite to that in said second magnet means.

35. A sputtering device as in claim 34 where the thickness of the sputtering surface layer is at least 1 inch.

36. A sputtering device as in claim 34 where the flux in the further magnet means extends from a first pole to a second pole thereof and where said other pole of the first magnet means is adjacent at least the pole of like polarity of said further magnet means.

37. A sputtering device as in claim 36 where said one pole of the first magnet means is adjacent both poles of said further magnet means.

38. A sputtering device as in claim 23 where the flux in said second magnet means is perpendicular with respect to the flux in said first magnet means.

39. A sputtering device as in claim 23 or 24 where said second magnet means is disposed between said poles of the first magnet means so that the second magnet means interrupts at least some of the flux in said first magnet means.

40. A sputtering device as in claim 39 where said second magnet means completely interrupts the flux in said first magnet means.

41. A sputtering device as in claim 39 where the flux direction in said second magnet is substantially perpendicular to that in said first magnet means.

42. A sputtering device as in claim 39 where the flux direction in said second magnet means is substantially parallel to and opposite that in said first magnet means.

43. A sputtering device as in claim 39 including a further magnet means disposed between said poles of the first magnet means so that the further magnet means interrupts at least some of the flux in said first magnet means.

44. A sputtering device as in claim 43 where said further magnet means completely interrupts the flux in said first magnet means.

45. A sputtering device as in claim 43 where the flux directions in said further magnet means and said second magnet means are substantially parallel and opposite to one another and where said flux directions are substantially perpendicular to the flux direction in said first magnet means.

46. A magnetically enhanced sputtering device comprising
 a cathode, at least a portion of which is provided with a planar sputtering surface;
 an anode spaced from said cathode for establishing an electric field therebetween; and
 magnetic means for establishing a magnetic field where at least some of the lines of force of the field extend parallel to and over said planar sputtering surface, said magnetic means including first magnet means disposed on the side of said cathode opposite said planar sputtering surface and extending along a line substantially parallel to the sputtering surface where the flux in said first magnet means extends from a first pole thereof to a second pole thereof, said first magnet means having a varying cross sectional area between said poles to effect shaping of said field over the planar sputtering surface.

47. A sputtering device as in claim 46 where said varying cross sectional area is effected by at least one slot disposed between said poles which at least partially interrupts the flux in said first magnet means, said lines of force being more parallel to said surface than what they would be in the absence of said slot.

48. A sputtering device as in claim 47 where said slot completely interrupts the flux in the magnet means.

49. A sputtering device as in claims 47 or 48 where said slot contains magnetically permeable material.

50. A sputtering device as in claims 47 or 48 where said slot contains an electrically insulating material.

51. A magnetically enhanced sputtering device comprising
 a cathode, at least a portion of which is provided with a sputtering surface having a peripheral portion;
 an anode spaced from said cathode for establishing an electric field therebetween;
 magnetic means for establishing a magnetic field where at least some of the lines of force of the field extend parallel to and over said sputtering surface to effect electron entrapment over the sputtering surface; and
 erosion preventing means disposed adjacent said cathode for preventing sputtering of at least some of said peripheral portion of the sputtering surface, said erosion preventing means including a predetermined surface inclined at an angle toward the surface of the cathode and so adapted that at least a majority of said lines of force pass through and are substantially perpendicular to the predetermined surface so that erosion thereat is substantially prevented.

52. A magnetically enhanced sputtering device comprising
 a cathode, at least a portion of which is provided with a sputtering surface;
 an anode spaced from said cathode for establishing an electric field therebetween; and
 magnet means for establishing a magnetic field where at least some of the lines of force of the field extend over said sputtering surface, said magnet means comprising a flexible material.

53. A sputtering device as in claim 52 where said magnet means includes a first plurality of layers of magnetized tape where at least one of the layers at least partially overlaps at least one of the layers adjacent thereto.

54. A sputtering device as in claim 53 where at least a portion of said one layer of magnetized tape and the layer adjacent thereto are non-linear along the respective lengths thereof.

55. A sputtering device as in claim 54 where said one layer and the layer adjacent thereto are substantially perpendicular to said sputtering surface.

56. A sputtering device as in claim 54 where said one layer and the layer adjacent thereto are substantially parallel to said sputtering surface.

57. A sputtering device as in claim 53 where said first layers of magnetized tape are disposed on the side of said cathode opposite said sputtering surface.

58. A sputtering device as in claims 53 or 57 where said layers of magnetized tape are arranged in a closed loop configuration.

59. A sputtering device as in claim 58 where said closed loop configuration is effected by a single strip of said tape wound as a spiral.

60. A sputtering device as in claim 59 where at least a portion of said sputtering surface is symmetrically disposed about a center line perpendicular to a plane containing said portion of the sputtering surface.

61. A sputtering device as in claim 58 where said layers are concentrically disposed with respect to each other.

62. A sputtering device as in claim 58 where at least a portion of said sputtering surface is symmetrically disposed about a center line perpendicular to a plane containing said portion of the sputtering surface.

63. A magnetically enhanced sputtering device comprising
 a cathode, at least a portion of which is provided with a planar sputtering surface;
 an anode spaced from said cathode for establishing an electric field therebetween; and
 magnet means for establishing a magnetic field where at least some of the lines of force of the field extend parallel to and over said planar sputtering surface, said magnet means including a first plurality of layers of magnetized tape concentrically disposed on the side of said cathode opposite said planar sputtering surface where each layer is adjacent to and at least partially overlaps at least one of the layers adjacent it so that a substantially solid, flat coil is formed by said plurality of layers.

64. A sputtering device as in claim 63 where the coil is substantially parallel to said sputtering surface.

65. A sputtering device as in claims 63 or 64 where at least some of the layers are substantially perpendicular to said sputtering surface.

66. A sputtering device as in claims 63 or 64 where at least some of the layers are substantially parallel to said sputtering surface.

67. A sputtering device as in claims 63 or 64 where at least some of the layers are disposed at an angle of 40°–60° with respect to a perpendicular to said sputtering surface.

68. A sputtering device as in claim 67 where said angle is 50°–55°.

69. A sputtering device as in claims 63 or 64 where each layer closely contacts the layers adjacent it at least in the non-linear portions of said coil.

70. A sputtering device as in claim 63 where each layer of the coil is in physical contact with the layer adjacent it.

71. A magnetically enhanced sputtering device comprising
   a cathode, at least a portion of which is provided with a planar sputtering surface;
   an anode spaced from said cathode for establishing an electric field therebetween; and
   magnet means for establishing a magnetic field where at least some of the lines of force of the field extend parallel to and over said planar sputtering surface, said magnet means including a wound strip of at least one magnetized tape having a coil-like configuration disposed on the side of said cathode opposite said planar sputtering surface where each turn of the coil is adjacent to and at least partially overlaps at least one of the turns adjacent it so that a substantially solid, flat coil is formed by said wound strip.

72. A sputtering device as in claim 71 where the coil is substantially parallel to said sputtering surface.

73. A sputtering device as in claims 71 or 72 where each turn closely contacts the turns adjacent it at least in the non-linear portions of the coil.

74. A sputtering device as in claim 72 where at least some of the turns are substantially perpendicular to said sputtering surface.

75. A sputtering device as in claim 72 where at least some of the turns are substantially parallel to said sputtering surface.

76. A sputtering device as in claim 72 where at least some of the turns are disposed at an angle of 40°–60° with respect to a perpendicular to said sputtering surface.

77. A sputtering device as in claim 76 where said angle is 50°–55°.

78. A sputtering device as in claim 71 where each turn of the coil is in physical contact with the turn adjacent it.

* * * * *